United States Patent [19]
Ahn et al.

[11] Patent Number: 5,470,619
[45] Date of Patent: Nov. 28, 1995

[54] METHOD OF THE PRODUCTION OF POLYCRYSTALLINE SILICON THIN FILMS

[75] Inventors: Byung T. Ahn; Dae G. Moon; Jeong N. Lee, all of Seoul, Rep. of Korea

[73] Assignee: Korea Advanced Institute of Science and Technology, Taejon, Rep. of Korea

[21] Appl. No.: 282,643

[22] Filed: Jul. 29, 1994

[30] Foreign Application Priority Data

Sep. 7, 1993 [KR] Rep. of Korea .................. 93-17870

[51] Int. Cl.⁶ .................. B05D 3/06; C23C 16/24
[52] U.S. Cl. .................. 427/578; 427/573; 427/255; 427/255.1; 427/314; 427/402; 437/233
[58] Field of Search .................. 427/578, 573, 427/255, 255.1, 402, 314; 428/428; 437/233

[56] References Cited

U.S. PATENT DOCUMENTS

| | | | |
|---|---|---|---|
| 4,406,709 | 9/1983 | Celler et al. ............. | 148/1.5 |
| 5,116,811 | 5/1992 | Abe et al. ............. | 505/734 |
| 5,130,103 | 7/1992 | Yamagata et al. ............. | 428/209 |
| 5,242,855 | 9/1993 | Oguro ............. | 437/109 |
| 5,318,919 | 6/1994 | Nouguchi et al. ............. | 437/41 |

FOREIGN PATENT DOCUMENTS

| | | |
|---|---|---|
| 3-256333 | 3/1991 | Japan . |
| 4-144122 | 4/1992 | Japan . |

OTHER PUBLICATIONS

R. B. Iverson et al, "Recrystallization of Amorphized Polycrystalline Silicon Films on $SiO_2$", J. Appl. Phys., vol. 62, pp. 170–176 (1987).

K. Nakazawa et al, "Effect of Substrate Temperature on Recrystallization of Plasma Chemical Vapor Deposition Amorphous Silicon Films", J. Appl. Phys., vol. 68(3), pp. 1029–1032 (1990).

K. Nakazawa, "Recrystallization of Amorphous Silicon Films Deposited by Low–Pressure Chemical Vapor Deposition From $Si_2H_6$ Gas", J. Appl. Phys., vol. 69(3), pp. 1703–1706 (1991).

A. T. Voutsas, "Deposition and Crystallization of a–Si Low Pressure Chemically Vapor Deposited Films Obtained by Low–Temperature Pyrolysis of Disilane", J. Electrochem. Soc., vol. 140, No. 3, pp. 871–877 (1993).

Primary Examiner—Roy V. King
Attorney, Agent, or Firm—Burns, Doane, Swecker & Mathis

[57] ABSTRACT

A method is disclosed for the production of polycrystalline silicon thin films characterized by performing heat treatment of amorphous silicon thin films deposited on a substrate at a relatively low temperature of between 300° and 600° C. under a pressure ranging from $10^{-3}$ to 1 torr. The method can provide polycrystalline silicon thin films having increased grain sizes of about 60–300 μm. In accordance with the method, glass or ceramic substrates can be used instead of an expensive quartz substrate. $SiH_4$ gas can also be used instead of $Si_2H_6$ gas as a source gas. The polycrystalline silicon thin films disclosed have an electron and positive hole mobility closer to that of the level of single crystals, and thus the development of the SOI element having high performance such as TFT for LCD, or TFT for SRAM, and the like may be greatly advanced.

5 Claims, 4 Drawing Sheets

METHOD OF THE PRODUCTION OF POLYCRYSTALLINE SILICON THIN FILMS

BACKGROUND OF THE INVENTION

1. Field of the Invention

The present invention relates to an improvement in a method for the production of polycrystalline silicon thin films. More particularly, the invention relates to a method for the production of polycrystalline silicon thin films comprising heat treatment of an as-deposited amorphous silicon thin film at relatively low temperatures under specific pressure, and to a polycrystalline silicon thin film having increased grain size prepared by the method.

2. Description of the Prior Art

Polycrystalline silicon thin films have received enormous commercial interest for their recent various applications in the fabrication of thin film transistors (TFT) for liquid crystal display (LCD), TFT for static random access memory (SRAM), solar cell, silicon on insulator (SOI), and the like. For such applications, the polycrystalline silicon thin films should have a grain size as large as possible in order to ensure high field effect mobility.

Several processes for preparing polycrystalline silicon thin films have been known. For example, Japanese Laid-Open Patent Publication No. 256,333/1991 discloses a process for preparing a semiconductor device comprising heat treatment of an amorphous silicon film coated on a single crystal semiconductor substrate at below 500° C. to make the amorphous silicon film compact, and single crystallization of the compact amorphous silicon film by heat treatment at below 1,200° C. in an inert gas atmosphere or a nitrogen gas atmosphere. The disclosed process comprises heat treatment at a high temperature of below 1,200° C., resulting in exclusion of the possibility of using substrates having low melting temperatures. The resulting single crystallized silicon films have been described as having a grain size of about only 5 μm.

Japanese Laid-Open Patent Publication No. 144,122/1992 discloses a process for preparing a polycrystalline silicon thin film by heat treatment at 600° C. of a certain amorphous silicon film having a specific refractive index and extinction coefficient. The selected amorphous silicon films have been deposited by low pressure chemical vapor deposition (LPCVD) using expensive $Si_2H_6$ rather than inexpensive $SiH_4$ as a source gas. The resulting polycrystalline silicon thin films are found to have a grain size of 2.0–3.0 μm.

It has been reported that recrystallization of an amorphous silicon film which has been deposited by LPCVD of silane at 640° C. onto a thermally oxidized silicon wafer and has been amorphized by implantation of silicon ions, provides a polycrystalline silicon film having a grain size of 2.5 μm at an anneal temperature of 580° C. and 1.5 μm at an anneal temperature of 640° C. See, R. B. Iverson et at., J. Appl. Phys., Vol. 62, p.1675 (1987).

It has also been reported that the grain size of the polycrystalline silicon thin films recrystallized from amorphous silicon films which have been deposited by plasma chemical vapor deposition (PCVD) using a hydrogen-diluted $SiH_4$ gas can be increased up to 4.0 μm by decreasing the substrate temperature and nucleation rate. The amorphous silicon films are annealed at 600° C. in a $N_2$ atmosphere. See, Nakazawa et at., J. Appl. Phys., Vol.68(3), p.1029 (1990).

Nakazawa further reported in J. Appl. Phys., Vol. 69(3), p.1703–1706(1991) that the grain size of the polycrystalline silicon films recrystallized from $Si_2H_6$ gas is larger than that from $SiH_4$ gas. It has been reported that recrystallization of amorphous Si films deposited on a quartz substrate by LPCVD from $Si_2H_6$ gas by annealing at 600° C. in a $N_2$ atmosphere gives poly-Si films having a grain size of 5 μm.

It has been further known that the grain size of the polycrystalline silicon films crystallized from the amorphous silicon deposited by thermal CVD of disilane depends upon the deposition conditions; particularly it increases as the deposition rate increases. The deposition has been performed onto silicon wafers by LPCVD using a mixture of 5% disilane in helium as a source gas. Then, the as-deposited amorphous silicon films are subject to crystallization by annealing at 550°–650° C. See, Voutsas et at., J. Electrochem. Soc., Vol. 140, No.3, pp 871–877(1993).

However, no processes have yet been proposed which can provide polycrystalline silicon thin films having a grain size of above 5 μm. Although disilane is more expensive than silane, the former is preferably used as a source gas. In addition, prior art processes have suffered from the drawback that heat treatment or annealing of amorphous silicon films should be performed at relatively high temperatures of above 600° C., which excludes the possibility of use of low melting temperature materials, e.g., glass or ceramic plate, as a substrate. No research has been made on the effect of the pressure used during the heat treatment or during annealing of as-deposited amorphous silicon films on the grain size of the resulted polycrystalline thin films.

Therefore, in order to overcome the disadvantages encountered in the prior art techniques, we, the inventors of the present invention, conducted an intensive study on the production of polycrystalline silicon thin films, particularly on the effect of temperatures and pressures used in heat treatment for crystallization of deposited amorphous silicon films on the grain size. As a result, we have now achieved the present invention on the basis of the unexpected discovery that the annealing or heat treatment pressure of as-deposited amorphous silicon films influences mainly the grain size of the resulting polycrystalline silicon thin films.

SUMMARY OF THE INVENTION

It is therefore a primary object of the invention to provide an improvement in a method of producing a polycrystalline silicon thin film.

It is another object of the invention to provide an economically efficient method of producing a polycrystalline silicon thin film using silane as a source gas and a glass or ceramic plate as a substrate.

It is a further object of the invention to provide polycrystalline silicon thin films having an increased grain size of about 60–300 μm.

Further objects and advantages of the present invention will become apparent from the following description.

DESCRIPTION OF THE DRAWINGS

The present invention will be described in greater detail in accordance with the accompanying drawings, wherein.

DETAILED DESCRIPTION OF THE INVENTION

In one aspect of the invention, a polycrystalline silicon thin film is produced by heat treating an as-deposited amorphous silicon thin film at a temperature of 450° to 550° C. under a pressure of $10^{-3}$ to 1 torr.

In another aspect of the invention, the polycrystalline silicon thin film having a grain size of about 60–300 µm are produced.

Figure 1:
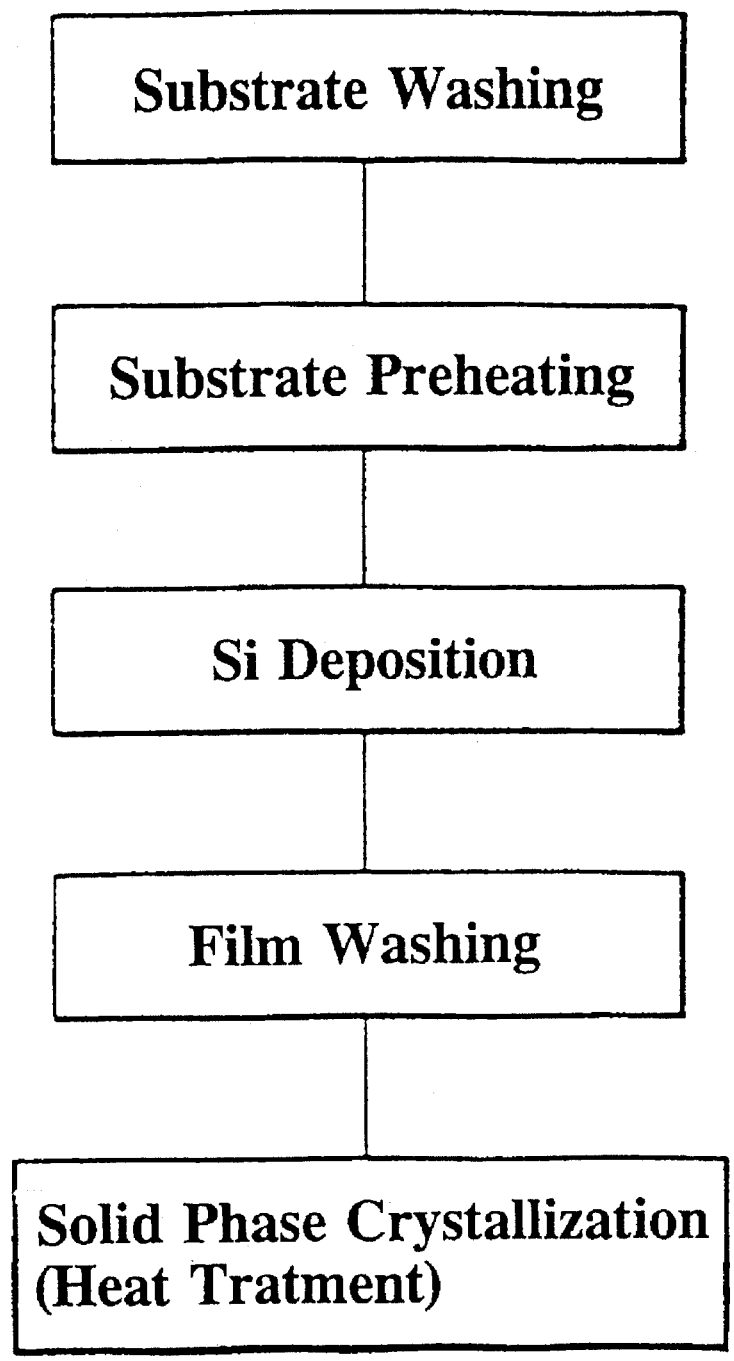
FIG. 1 is a flow chart showing a method of producing a polycrystalline silicon thin film according to the invention.

Referring now to FIG. 1, it can be understood that in accordance with the invention, a substrate should be first prepared and then washed with a cleansing solution. Washing the substrates can be carried out by a conventional method, for example, an ultrasonic cleaning technique.

As a substrate, any material that has been known in the art can be used. Especially, it is possible to use materials having low melting points, such as glass or ceramic plates, as a substrate, because the heat treatment of amorphous silicon thin films according to the invention may be performed at a relatively low temperature, for example, below 600° C. Examples of the substrate which can be used in the invention include glass plates, ceramic plates, quartz plates, and Si wafers. These plates or wafers may be coated with amorphous materials such as $SiO_2$, silicon nitride, silicon oxynitride, tantalum oxide and the like. The glass plates are preferably used because they are a low-priced substrate.

Then, the washed substrate is placed in a PECVD chamber or a LPCVD chamber and heated at a temperature sufficient to degas it, for example, at about 400° C. The degassed substrate is heated ranging from room temperature to 600° C. in the atmosphere of a source gas to deposit an amorphous silicon thin film thereon.

As a source gas, according to the prior art techniques, $Si_2H_6$ gas is preferably used over $SiH_4$ gas. However, the invention allows to use $SiH_4$ gas which is less expensive than $Si_2H_6$ gas, for example Ar-, He-, $H_2$- or $N_2$-diluted $SiH_4$ gas as a source gas. This constitutes a further advantage of the invention.

The flow rate of the gas is ranged from about 1 to 500 sccm, and the RF power used is ranged from about 1 to 600 W. Amorphous silicon thin films may be deposited in thicknesses between tens Å and several µm. Deposition may be followed by implantation of Si ions to increase the disorder of the deposited amorphous silicon films. Then, the as-deposited amorphous silicon films are washed by conventional methods such as an ultrasonic cleaning technique. The amorphous silicon thin films thus washed are heat-treated or annealed to induce solid crystallization. The heat treatment or annealing may be performed on a Cu or brass susceptor.

According to the prior art techniques, the heat treatment or annealing has been performed at high temperatures of about 600° C. or higher. According to the invention, however, the heat treatment or annealing can be carried out at relatively low temperatures under a specific pressure to give polycrystalline silicon thin films having a larger grain size. Heat treatment of the as-deposited amorphous silicon films can be performed at a temperature between 450° and 550° C., which is much lower than that of the prior art processes, and under a specific pressure between $10^{-3}$ and 1 torr.

Figure 2:
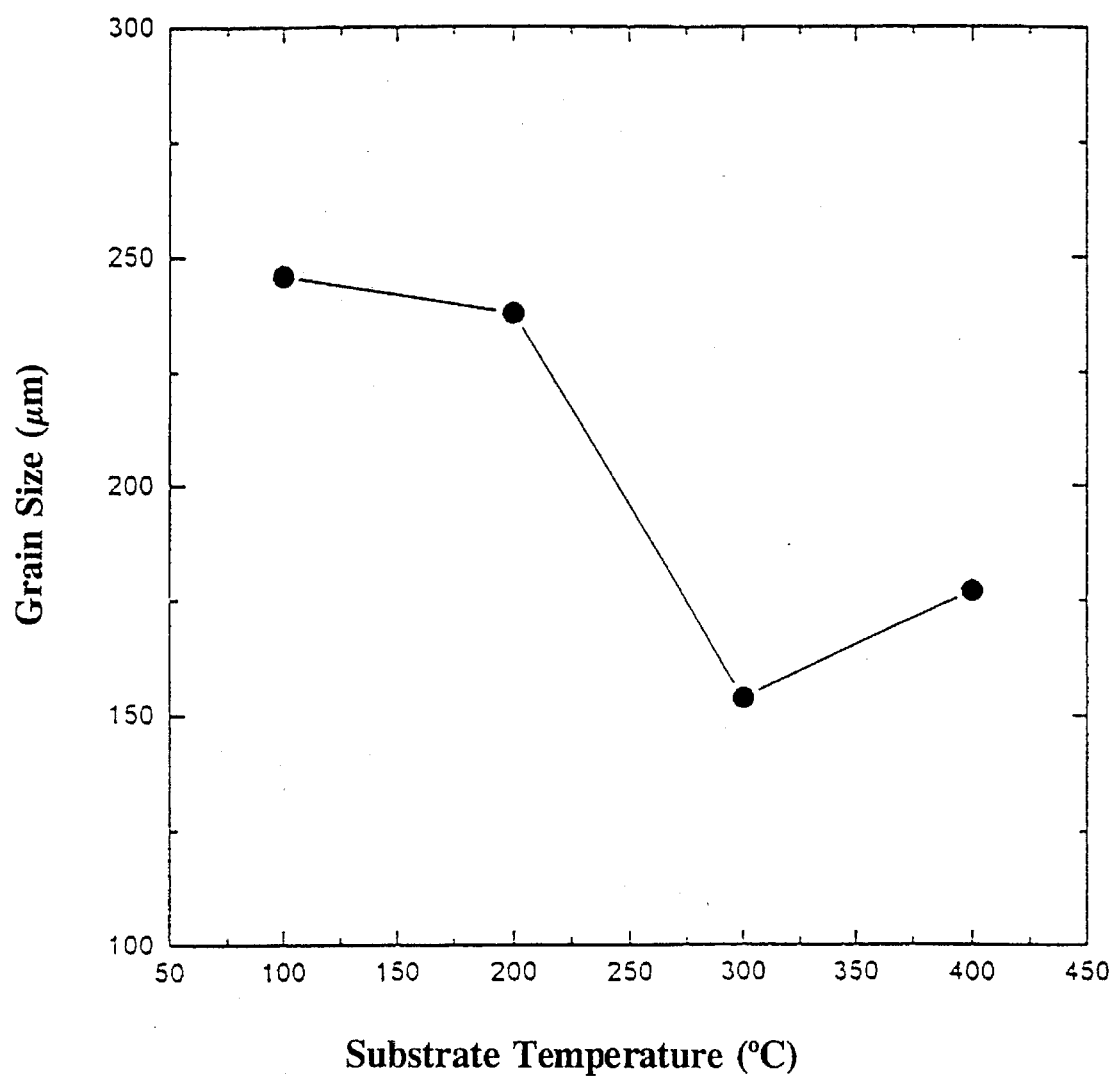
FIG. 2 is a graph showing the effect of the deposition temperature on the grain size of the polycrystalline silicon thin film produced by the method according to the invention.
Figure 3:
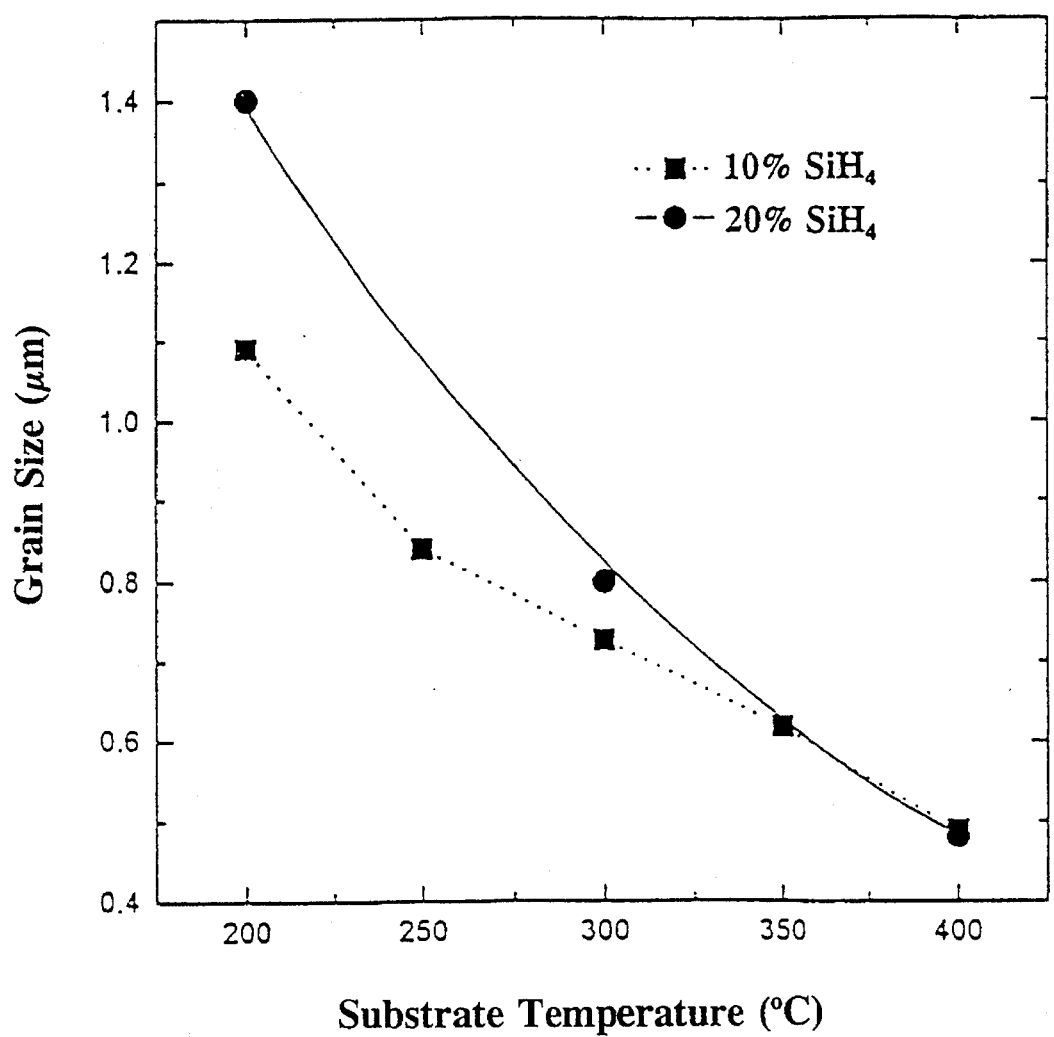
FIG. 3 is a graph showing the effect of the deposition temperature on the grain size of the polycrystalline silicon thin film produced by the method according to a prior art process.

FIGS. 2 and 3 illustrates the changes of the grain size, depending on the deposition temperatures, of the polycrystalline silicon thin films produced by the methods in accordance with the invention and the prior art process, respectively. As can be seen from FIGS. 2 and 3, the present invention provides the polycrystalline silicon thin films having a grain size of about 150 to 250 µm (Example 1), which is 100 times larger than that of the polycrystalline silicon thin films prepared by the conventional method (up to about 1.5 µm; Comparative Example 1), although $SiH_4$ is used instead of $Si_2H_6$ as a source gas.

Figure 4B:
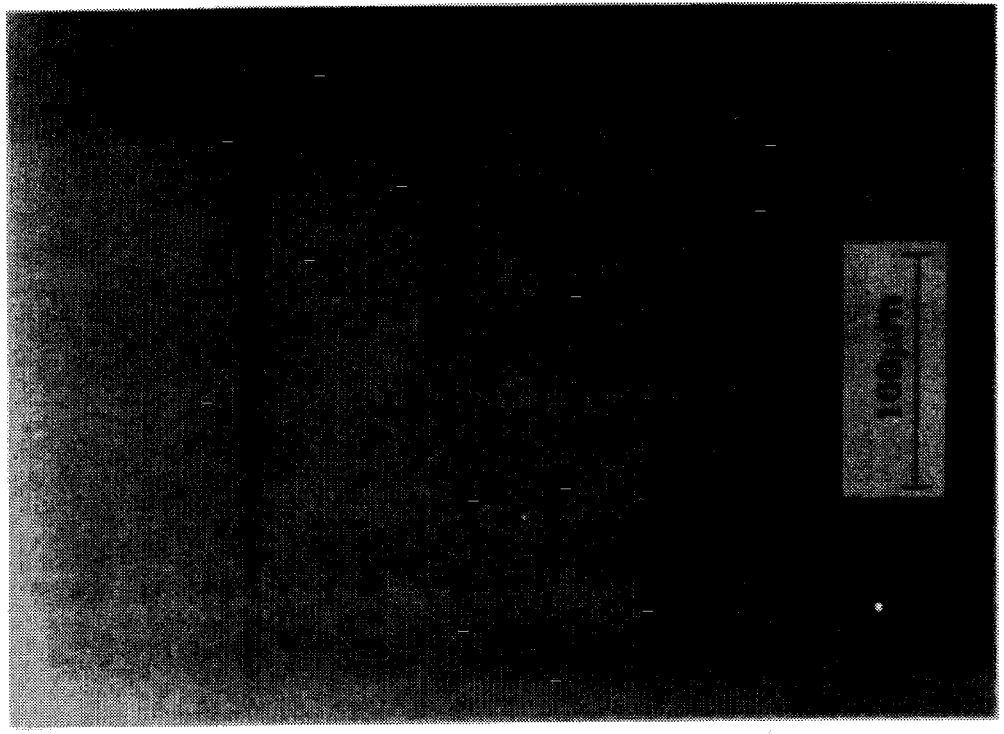
FIG. 4B is a microphotograph showing the structure of the polycrystalline silicon thin film (thickness: about 1,000 Å) produced according to a prior art process.
Figure 4A:
FIG. 4A is a microphotograph showing the structure of the polycrystalline silicon thin film (thickness: about 1,000 Å) produced by the method according to the invention.

FIGS. 4A and 4B are microphotographs of the initial phases of the crystallized polycrystalline silicon thin films (thickness: about 1,000 Å) produced by the methods in accordance with the invention (Example 2) and the prior art process (Comparative Example 2), respectively.

When amorphous silicon thin films are crystallized at a low temperature, crystalline grains at the initial stage of crystallization grow in a dendritic structure. As time passes, the grains contact each other, resulting in the formation of the grains in full grain sizes. Thus, when crystallization of the amorphous silicon thin films is completed, the films will be composed of 100% polycrystals. Therefore, since it is difficult to observe through a microphotograph the shape or the size of the crystals formed, we compared grain sizes of the polycrystalline silicon thin films from the microphotographs of their initial crystallized phases, which make the distinction of the shape or size of crystals easy.

The dark portions in FIG. 4B indicate crystalline grains which are being grown by crystallization in accordance with prior art processes. Their sizes were less than about 2 µm.

The grain size of the polycrystalline silicon thin films prepared by the invention is larger than about 60 µm, thus is at least 12 times larger than that of the polycrystalline silicon thin films produced by prior art methods. This permits the mobility of electrons and the positive holes of the polycrystalline silicon thin films to be increased to a level found in a single crystal. It has now been possible to advance the development of high-performance SOI elements, such as polycrystalline silicon TFT for LCD, polycrystalline silicon TFT for SRAM, and the like, which have received worldwide commercial interest for their recent applications, despite the past serious technical problems experienced in their development. Furthermore, in accordance with the present invention, it is possible to use $SiH_4$ gas as a source gas, which is much less expensive than $Si_2H_6$ gas and is commonly used for improving the homogeneity of the silicon thin film prepared, and it is also possible to use glass or ceramic plates as a substrate. And the heat treatment can be performed at temperatures lower than prior art processes by about 200° C. Therefore, the costs for the production of a polycrystalline silicon thin films can be considerably reduced.

DESCRIPTION OF THE PREFERRED EMBODIMENT

The present invention will be illustrated in greater detail by way of the following examples. The examples are given for illustration of the invention and are not intended to be limiting thereof.

EXAMPLE 1

This example shows the effect of deposition temperatures on the grain size of the final polycrystalline silicon thin film.

Four glass substrates were prepared and washed using an ultrasonic cleaning technique. The washed substrates were placed in a PECVD chamber, and then heated at about 400° C. for about 12 hours to degas. The degassed substrates were then subject to deposition in an atmosphere of 20% $SiH_4$ gas in Ar under the following deposition conditions: deposition temperature: 100° C., 200° C., 300° C., and 400° C.; deposition pressure: 0.4 torr; RF power: 10 W; and gas flow rate: 150 sccm.

An amorphous silicon thin film having a thickness of about 0.1 μm was deposited onto the substrates. The substrates on which the amorphous silicon thin films were deposited were washed by ultrasonic cleaning, placed on a copper or brass susceptor in a heating furnace, and heated at a temperature of about 500° C. under $10^{-2}$ ton in a $N_2$ atmosphere to induce solid phase crystallization. Polycrystalline silicon thin films having a grain size of 150–250 μm ware obtained as shown in FIG. 2.

Comparative Example 1

The same procedure as in Example 1 was repeated except that the substrates on which the amorphous silicon films were deposited were placed on a stainless steel or quartz susceptor in a heating furnace and the heat treatment was performed at 600° C. under 1 atm. A polycrystalline silicon thin film having a grain size of 0.5–1.4 μm was obtained as shown in FIG. 3.

In addition, the same procedure was performed using 10% $SiH_4$ instead of 20% $SiH_4$ as a source gas. Similar results were obtained as shown in FIG. 3.

EXAMPLE 2

A Si wafer coated with $SiO_2$ was prepared and washed using an ultrasonic cleaning technique. Then, the washed substrate was placed in a LPCVD chamber, and heated at a temperature of 400° C. for about 12 hours to degas. The degassed substrate was subject to deposition under the following deposition conditions: deposition temperature: 550° C.; deposition pressure: 0.6 torr; and gas flow rate: 25 sccm. Then, Si ions were implanted into the as-deposited amorphous silicon thin film at a dose of $10^{20}$ $cm^{-3}$ to increase the disorder. The Si ion-implanted film was washed by ultrasonic cleaning, placed on a copper or brass susceptor in a heating furnace, and then heated at a temperature of about 500° C. under $10^{-2}$ torr to induce solid phase crystallization. The resulting polycrystalline silicon thin film had a grain size of 150 μm. FIG. 4A is an optical microphotograph of the initial phase of the recrystallized polycrystalline silicon thin film thus obtained.

Comparative Example 2

The same procedure as described in Example 2 was repeated, except that the Si ionimplanted film was placed on a stainless steel or quartz susceptor and the heat treatment was performed at 600° C. in 1 atm $N_2$. A polycrystalline silicon thin film having a grain size of 2–3 μm was obtained. FIG. 4B is an optical microphotograph of the initial phase of the polycrystalline silicon thin film thus obtained.

EXAMPLES 3 TO 6

The same deposition procedure as described in Example 1 was repeated, except the deposition temperature was set at 100° C. The same heat treatment procedure as described in Example 1 was repeated except that the procedure was performed under the pressures shown in Table 1 below. The grain size of the polycrystalline silicon thin films thus obtained is also shown in Table 1.

TABLE 1

| Grain Size to Pressure of Heat Treatment | | | | |
|---|---|---|---|---|
| Pressure (torr) | 0.001 | 0.01 | 0.1 | 1 |
| Grain Size (μm) | about 150 | 60–75 | 75–98 | 60–150 |

What is claimed is:

1. In a method of producing a polycrystalline silicon thin film having a grain size of about 60–300 μm comprising depositing an amorphous silicon thin film onto a substrate and subjecting the resulting as-deposited amorphous silicon thin film to heat treatment, the improvement which comprises carrying out said heat treatment at a temperature between 450° and 550° C. under a vacuum pressure ranging from $10^{-3}$ to 1 torr, and placing the substrate on which said amorphous silicon thin film is deposited on a copper or brass susceptor in a heating furnace.

2. The method according to claim 1, wherein the deposition is carried out by low pressure chemical vapor deposition or plasma enhanced chemical vapor deposition using $SiH_4$ gas as a source gas.

3. The method according to claim 2, wherein the $SiH_4$ gas is selected from the group consisting of an Ar-, He-, $H_2$- and $N_2$-diluted $SiH_4$ gas.

4. The method according to claim 1, wherein the substrate is selected from the group consisting of glass, ceramic, and quartz plates, and Si wafers.

5. The method according to claim 4, wherein the glass, ceramic, and quartz plates, and Si wafers are coated with an amorphous material selected from the group consisting of $SiO_2$, silicon nitride, silicon oxynitride, and tantalum oxide.

* * * * *